(12) United States Patent
Noh

(10) Patent No.: US 10,867,648 B2
(45) Date of Patent: Dec. 15, 2020

(54) MEMORY SYSTEM AND OPERATING METHOD THEREOF

(71) Applicant: SK hynix Inc., Gyeonggi-do (KR)

(72) Inventor: Hyun-Jin Noh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/673,662

(22) Filed: Nov. 4, 2019

(65) Prior Publication Data

US 2020/0357447 A1    Nov. 12, 2020

(30) Foreign Application Priority Data

May 9, 2019    (KR) .......................... 10-2019-0054224

(51) Int. Cl.
*G11C 7/00* (2006.01)
*G11C 7/22* (2006.01)
*G11C 7/10* (2006.01)
*G06K 9/62* (2006.01)
*G06F 13/16* (2006.01)
*G11C 16/34* (2006.01)

(52) U.S. Cl.
CPC .......... *G11C 7/222* (2013.01); *G06F 13/1689* (2013.01); *G06K 9/6256* (2013.01); *G11C 7/1066* (2013.01); *G11C 16/3459* (2013.01); *G11C 7/10* (2013.01); *G11C 7/22* (2013.01)

(58) Field of Classification Search
CPC .................. G11C 7/1093; G11C 7/222; G11C 2207/2254; G11C 29/023; G11C 29/028; G11C 7/10; G11C 7/1066; G11C 7/1084; G11C 7/22
USPC .................... 365/193, 189.07, 189.16, 233.1
See application file for complete search history.

(56) References Cited

U.S. PATENT DOCUMENTS

2017/0270982 A1*  9/2017  Song .................... G11C 29/028

FOREIGN PATENT DOCUMENTS

| KR | 10-2004-0041985 | 5/2004 |
|----|-----------------|--------|
| KR | 10-0681977 | 2/2007 |

* cited by examiner

*Primary Examiner* — Thong Q Le
(74) *Attorney, Agent, or Firm* — IP & T Group LLP

(57) ABSTRACT

A memory system includes a memory and a controller for providing the memory with a data strobe signal; and data synchronized with an internal data strobe signal, wherein the controller includes a signal generator for generating the data strobe signal, an inverter for selectively outputting one between a non-inverted data strobe signal having the same phase as the data strobe signal and an inverted data strobe signal having an inverted phase to the phase of the data strobe signal based on an inversion signal, a delayer for delaying the inverted data strobe signal or the non-inverted data strobe signal based on a delay signal and outputting the internal data strobe signal, and a trainer for performing a verification operation on the synchronized data and generating the inversion signal and the delay signal based on the verification operation result.

19 Claims, 10 Drawing Sheets

US 10,867,648 B2

MEMORY SYSTEM AND OPERATING METHOD THEREOF

CROSS-REFERENCE TO RELATED APPLICATIONS

The present application claims priority of Korean Patent Application No. 10-2019-0054224, filed on May 9, 2019, which is incorporated herein by reference in its entirety.

BACKGROUND

1. Field

Various embodiments of the present invention relate generally to a data processing system and, more particularly, to a memory system for performing a training operation and a method for operating the memory system.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main or an auxiliary data storage system of a portable electronic device.

Generally, memory systems provide excellent stability, durability, high information access speed, and low power consumption at least partly because they have no moving parts, as compared with a hard disk device. Examples of memory systems having such advantages include universal serial bus (USB) memory devices, memory cards having various interfaces, and solid-state drives (SSDs).

SUMMARY

Various embodiments of the present invention are directed to a memory system capable of performing a training operation to synchronize a sampling point of a data strobe signal with the center of a time cycle of an internal data strobe signal.

In accordance with an embodiment of the present invention, a memory system includes: a memory; and a controller suitable for providing the memory with: a data strobe signal (DQS); and data that is synchronized with an internal data strobe signal, wherein the controller includes: a signal generator suitable for generating the data strobe signal, an inverter suitable for receiving the data strobe signal and selectively outputting one signal between a non-inverted data strobe signal having the same phase as the data strobe signal and an inverted data strobe signal having an inverted phase to the phase of the data strobe signal based on an inversion signal, a delayer suitable for delaying the inverted data strobe signal or the non-inverted data strobe signal based on a delay signal and outputting the internal data strobe signal, and a trainer suitable for performing a verification operation on the synchronized data to produce a verification operation result, and generating the inversion signal and the delay signal based on the verification operation result, wherein, when the verification operation is successfully performed, the trainer generates the inversion signal so that the inverter outputs the inverted data strobe signal and generates the delay signal by increasing a value of the delay signal until the verification operation fails, and when the verification operation fails, the trainer generates the inversion signal so that the inverter outputs the non-inverted data strobe signal.

In accordance with another embodiment of the present invention, a method for operating a memory system includes: providing a memory with a data strobe signal (DQS) and data that is synchronized with an Internal data strobe signal; generating the data strobe signal; selectively outputting one signal between a non-inverted data strobe signal having the same phase as the data strobe signal and an Inverted data strobe signal having an Inverted phase to the phase of the data strobe signal based on an inversion signal; delaying the inverted data strobe signal or the non-inverted data strobe signal based on a delay signal and outputting the internal data strobe signal; generating the inversion signal for outputting the inverted data strobe signal when a verification operation is successfully performed; generating the delay signal by increasing a value of the delay signal until the verification operation fails; and generating the inversion signal to output the non-inverted data strobe signal when the verification operation fails.

In accordance with another embodiment of the present invention, a circuit includes: a signal generator suitable for generating a data strobe signal (DQS); an inverter suitable for selectively inverting the data strobe signal to output a selected data strobe signal among a non-inverted data strobe signal and an inverted data strobe signal; a delayer suitable for delaying the selected data strobe signal based on a delay signal to output the delayed data strobe signal as an internal data strobe signal; a synchronizer suitable for synchronizing data with the internal data strobe signal to output an internal data through a data pad; a trainer suitable for performing a verification operation between the internal data and input data received from the data pad, and generating the inversion signal and the delay signal based on the verification operation such that a phase difference between the internal data and the internal data strobe signal has a set phase difference, wherein the trainer generates the inversion signal such that the inverter outputs the inverted data strobe signal and generates the delay signal having a delay value corresponding to a fail of the verification operation when the verification operation is successfully performed, and wherein the trainer generates the inversion signal so that the inverter outputs the non-inverted data strobe signal when the verification operation fails.

These and other features and advantages of the present invention will become better understood from the following detailed description in conjunction with the accompanying drawings.

DETAILED DESCRIPTION

Figure 1:
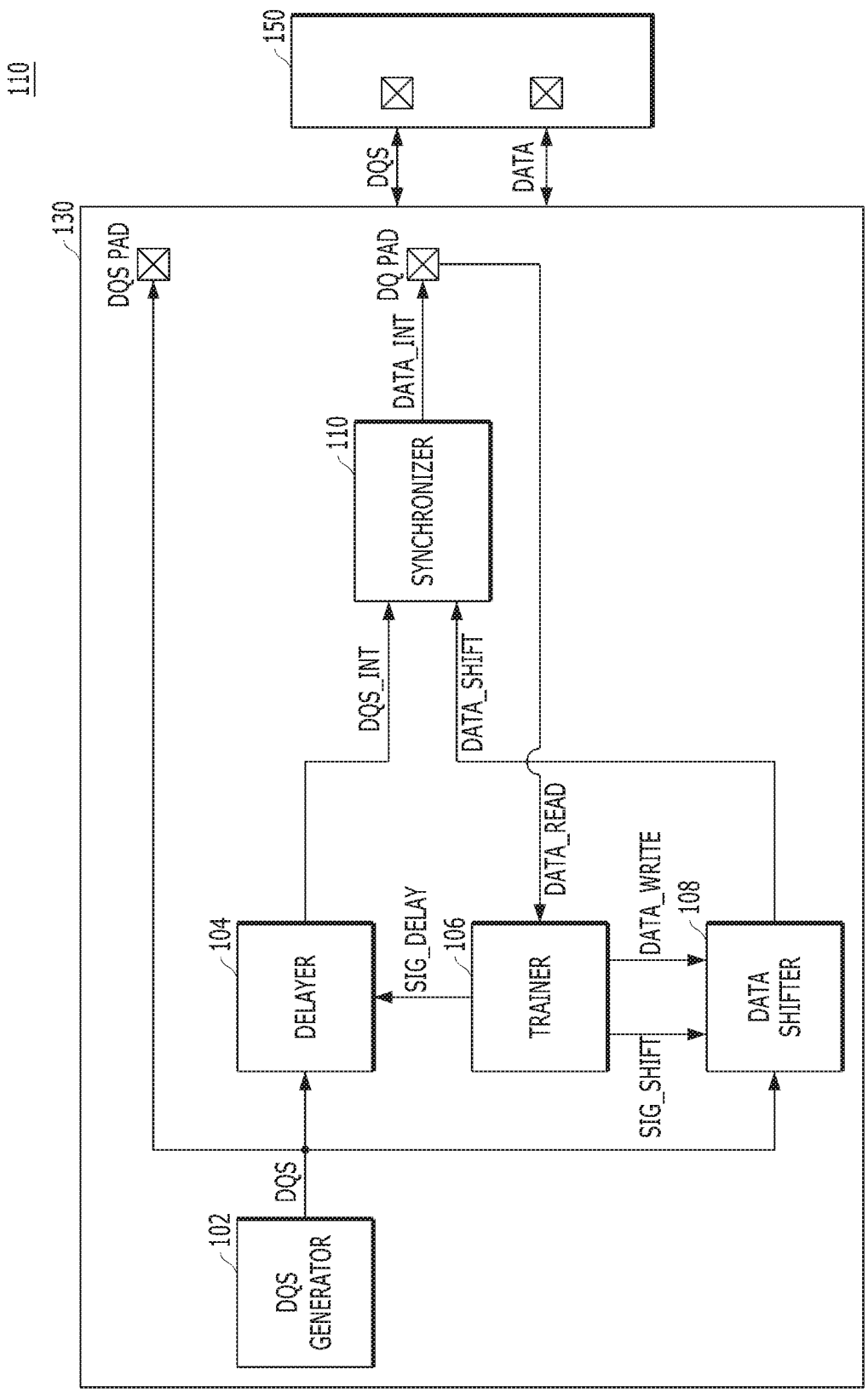
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those with ordinary skill in the art. Throughout the disclosure, like reference numerals refer to like parts throughout the various figures and embodiments of the present invention.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

Hereinafter, the embodiments of the present invention will be described in more detail with reference to the drawings.

FIG. 1 is a block diagram illustrating a memory system 110 in accordance with an embodiment of the present invention.

Referring to FIG. 1, the memory system 110 may include a controller 130 and a memory device 150.

The controller 130 may control the read and write operations of the memory device 150. The controller 130 may provide the memory device 150 with data DATA together with a data strobe signal DQS. The controller 130 may also generate an internal data strobe signal DQS_INT based on the data strobe signal DQS. For example, in the illustrated embodiment of FIG. 1, the controller 130 may generate the internal data strobe signal DQS_INT by delaying the phase of the data strobe signal DQS. The data DATA may be synchronized with the internal data strobe signal DQS_INT. The controller 130 may control the memory device 150 to write the data DATA based on the data strobe signal DQS. The controller 130 may control the memory device 150 to read the data DATA based on the data strobe signal DQS.

The memory device 150 may include a dynamic random access memory (DRAM). The memory device 150 may include a plurality of memory cells. The memory device 150 may write the data DATA into a memory cell under the control of the controller 130, and read the data DATA from the memory cell. The memory device 150 may provide the controller 130 with the data DATA that is read from the memory cell together with the data strobe signal DQS.

The controller 130 may include a DQS generator 102, a delayer 104, a trainer 106, a data shifter 108, and a synchronizer 110.

The DQS generator 102 may be implemented as a circuit for generating the data strobe signal DQS and provide the memory device 150 with the data strobe signal via a DQ pad. As described above, the data strobe signal DQS may be used by the memory device 150 to read the data provided from the controller 130. Also, the DQS generator 102 may provide the data strobe signal DQS to the delayer 104 and the data shifter 108.

The delayer 104 may be a circuit capable of outputting an internal data strobe signal DQS_INT by delaying the phase of the data strobe signal DQS. The internal data strobe signal DQS_INT may have the same cycle as the data strobe signal DQS but it may also have different phases depending on the degree of the delay. The delayer 104 may be realized as a circuit formed of a plurality of buffers that are serially coupled to each other. The degree of the delay of the data strobe signal DQS may be determined based on the number of the serially coupled buffers, and the phase of the internal data strobe signal DQS_INT may be different. The delayer 104 may be able to delay the phase of the data strobe signal DQS based on a delay signal SIG_DELAY provided from the trainer 106. The delayer 104 may provide the synchronizer 110 with the internal data strobe signal DQS_INT.

The data shifter 108 may be capable for delaying the phase of write data DATA_WRITE. The write data DATA_WRITE may be generated by the trainer 106 for a training operation. The data shifter 108 may synchronize the write data DATA_WRITE with a rising edge of the data strobe signal DQS to produce a synchronized data DATA_REF. The data shifter 108 may delay the synchronized data DATA_REF based on a shift signal SIG_SHIFT which is provided from the trainer 106. When the internal data strobe signal DQS_INT is delayed by a half cycle, the data shifter 108 may delay the synchronized data DATA_REF by a half cycle to produce a half cycle-delayed data DATA_SHIFT, by synchronizing the synchronized data DATA_REF with a falling edge of the data strobe signal DQS. When the internal data strobe signal DQS_INT is delayed by one cycle, the data shifter 108 may delay the data DATA_REF by one cycle to produce a one cycle-delayed data DATA_SHIFT2, by synchronizing the half cycle-delayed data DATA_SHIFT with a rising edge of the data strobe signal DQS. The data shifter 108 may select one among the synchronized data DATA_REF, the half cycle-delayed data DATA_SHIFT, and the one cycle-delayed data DATA_SHIFT2, and may provide the synchronizer 110 with the selected data as delayed data (DATA_SHIFT).

The synchronizer 110 may be capable of synchronizing the delayed data DATA_SHIFT with the internal data strobe signal DQS_INT. The synchronizer 110 may be realized as a flip-flop. The synchronizer 110 may synchronize the delayed data DATA_SHIFT with a rising edge of the internal data strobe signal DQS_INT. The synchronizer 110 may provide the memory device 150 with internal data DATA_INT synchronized with the internal data strobe signal DQS_INT, via the DQ pad.

The trainer 106 may be a circuit capable of performing a training operation to synchronize the internal data strobe signal DQS_INT to have a phase difference of a half cycle from the data strobe signal DQS. Specifically, the trainer 106 may perform a training operation for positioning the sampling point of the data strobe signal DQS at the center of the cycle of the data DATA_INT synchronized with the internal data strobe signal DQS_INT. The trainer 106 may perform a verification operation. The trainer 106 may verify the read data of the memory device 150 by comparing the write data DATA_WRITE with the read data DATA_READ. For example, when the write data DATA_WRITE and the read data DATA_READ are the same, the sampling point of the data strobe signal DQS may be positioned on the cycle of the internal data DATA_INT, and the trainer 106 may successfully perform the verification operation. Conversely, when the write data DATA_WRITE and the read data DATA_READ are different, the sampling point of the data strobe signal DQS may not be positioned on the cycle of the data DATA_INT, and the trainer 106 may fail the verification operation.

The trainer 106 may control the delayer 104 to output the internal data strobe signal DQS_INT. The trainer 106 may control the delayer 104 to output the internal data strobe signal DQS_INT based on the result of the verification operation. The trainer 106 may provide the delayer 104 with the delay signal SIG_DELAY to determine the phase of the internal data strobe signal DQS_INT. As described later with reference to FIG. 3, the trainer 106 may store a first delay count A, and a second delay count B. The first delay count A is a value of the delay signal SIG_DELAY when the sampling point of the data strobe signal DQS is positioned at the end of the cycle of the internal data DATA_INT. The second delay count B is a value of the delay signal SIG_DELAY when the sampling point of the data strobe signal DQS is positioned at an end point of the cycle of the internal data DATA_INT. The trainer 106 may designate the average value of the first delay count and the second delay count as the value of the delay signal SIG_DELAY. The trainer 106 may perform the training operation by controlling the delayer 104 to output the internal data strobe signal DQS_INT according to the delay signal SIG_DELAY.

The trainer 106 may generate the data DATA_WRITE and provide the data shifter 108 with the generated data DATA_WRITE. The trainer 106 may control the data shifter 108 to delay the phase of the data DATA_WRITE synchronized with the data strobe signal DQS based on the shift signal SIG_SHIFT. When the phase difference between the data strobe signal DQS and the internal data strobe signal DQS_INT is less than a half cycle, the trainer 106 may control the data shifter 108 by setting the shift signal SIG_SHIFT value to output the data DATA_SHIFT that is synchronized with a falling edge of the data strobe signal DQS. When the phase difference between the data strobe signal DQS and the internal data strobe signal DQS_INT is greater than or equal to a half cycle and less than one cycle, the trainer 106 may control the data shifter 108 by setting the shift signal SIG_SHIFT to delay the data synchronized with a falling edge of the data strobe signal DQS by a half cycle and output the half cycle-delayed data DATA_SHIFT1.

Figure 2A:
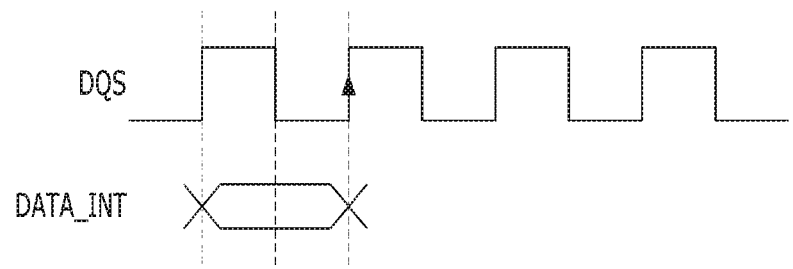
FIGS. 2A and 2C are timing diagrams illustrating data synchronized with a data strobe signal and an internal data strobe signal when a delay signal has an initial value.
Figure 2B:
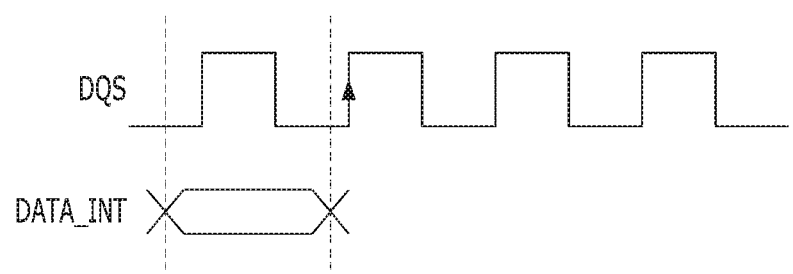
Figure 2C:
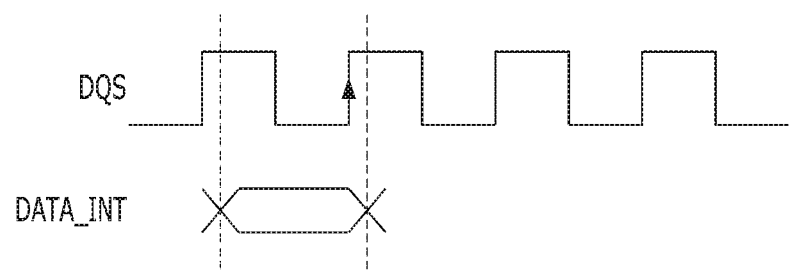

FIGS. 2A and 2C are timing diagrams illustrating data synchronized with the data strobe signal DQS and the internal data strobe signal DQS_INT when the delay signal has an initial value.

The memory device 150 may read the internal data DATA_INT with the value of the internal data DATA_INT synchronized with the internal data strobe signal DQS_INT, at the sampling point of the data strobe signal DQS which is provided from the controller 130. The sampling point may be a rising edge. When the sampling point of the data strobe signal DQS is positioned at the center of the cycle of the internal data DATA_INT, the data read error rate may be minimized. As described later with reference to FIG. 3, the trainer 106 may repeatedly perform a delay operation on an internal data strobe signal and a write and/or read verification operation so as to obtain the value of the delay signal SIG_DELAY for positioning the sampling point of the data strobe signal DQS at the start and end points of the internal data DATA_INT.

The initial value of the delay signal SIG_DELAY right after the fabrication may be set in such a manner that the sampling point of the data strobe signal DQS is positioned at the end point of the cycle of the internal data DATA_INT, as illustrated in FIG. 2A, so that the training operation may be completed by performing the internal DQS delay operation and the verification operation in a lesser number of times. However, even though the delay signal SIG_DELAY has the initial value which is set above due to the influence of external factors, the sampling point of the data strobe signal DQS may not be positioned on the cycle of the data DATA_INT as shown in FIG. 2B, or the sampling point of the data strobe signal DQS may be positioned near the end point of the cycle of the data DATA_INT, as shown in FIG. 2C.

Figure 3:
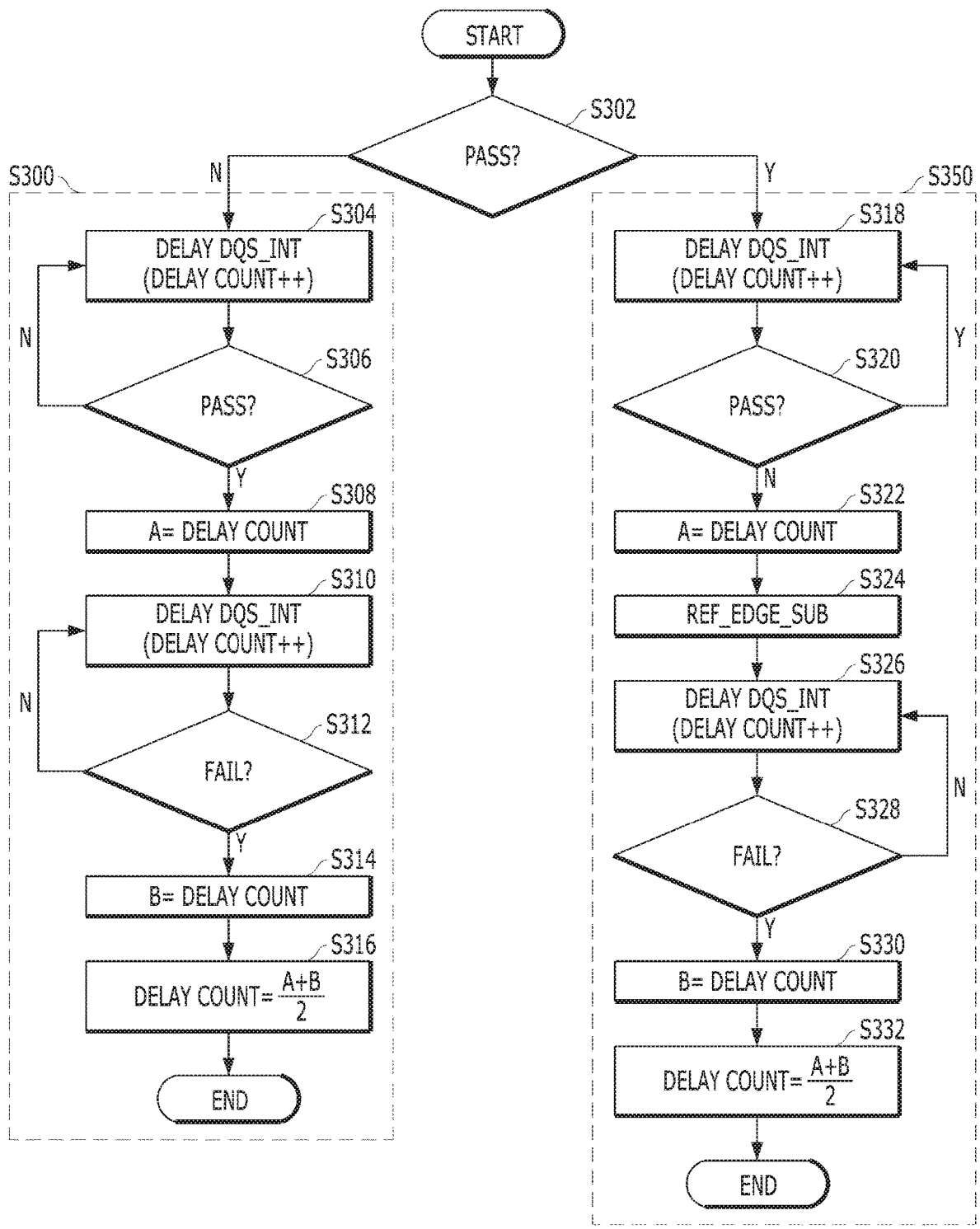
FIG. 3 is a flowchart of a training operation in accordance with an embodiment of the present invention.

FIG. 3 is a flowchart of a training operation in accordance with an embodiment of the present invention.

Referring to FIG. 3, in step S302, the trainer 106 may perform a verification operation. As illustrated in FIG. 2B, when the sampling point of the data strobe signal DQS is not positioned on the cycle of the data DATA_INT, the write data DATA_WRITE may be different from the read data DATA_READ, and the trainer 106 may fail the verification operation. As illustrated in FIG. 2C, when the sampling point of the data strobe signal DQS is positioned on the cycle of the data DATA_INT, the written data DATA_WRITE and the read data DATA_READ may be the same, and the trainer 106 may successfully perform the verification operation.

The step S300 may include steps S304 to S316.

In step S304, when the verification operation fails ('N' in step S302), the trainer 106 may provide the delayer 104 with the delay signal SIG_DELAY such that the delayer 104 may delay the phase of the internal data strobe signal DQS_INT. In other words, the trainer 106 may increase a delay count DELAY COUNT, which is a value of the delay signal SIG_DELAY, and provide the delayer 104 with the delay signal SIG_DELAY. The delayer 104 may output the internal data strobe signal DQS_INT which is delayed based on the delay signal SIG_DELAY.

In step S306, the trainer 106 may perform a verification operation again. When the verification operation performed based on the delay signal SIG_DELAY which is changed in the step S304 still fails ('N' in the step S306), the trainer 106 may repeatedly perform the operation of the step S304 until the verification operation is successfully performed. In other words, the trainer 106 may repeat the operation of the step S304 until the sampling point of the data strobe signal DQS is positioned at the end point of the cycle of the internal data DATA_INT.

In step S308, when the verification operation performed based on the delay signal SIG_DELAY which is changed in the step S304 is successfully performed ('Y' in the step S306), the trainer 106 may store the delay count DELAY_COUNT as a first delay count A.

In step S310, the trainer 106 may delay the phase of the internal data strobe signal DQS_INT by providing the delaying unit 104 with the delay signal SIG_DELAY. In other words, the trainer 106 may increase the delay count DELAY COUNT, which is a value of the delay signal SIG_DELAY, and provide the delayer 104 with the delay signal SIG_DELAY. The delayer 104 may output the internal data strobe signal DQS_INT which is delayed based on the delay signal SIG_DELAY.

In step S312, the trainer 106 may perform a verification operation again. When the verification operation performed based on the delay signal SIG_DELAY which is changed in the step S310 is successfully performed ('N' in the step S312), the trainer 106 may repeat the operation of the step S310. The trainer 106 may repeat the operation of the step S310 until the verification operation fails. In other words, the trainer 106 may repeatedly perform the operation of the step S310 until the sampling point of the data strobe signal DQS is positioned at the start point of the cycle of the internal data DATA_INT.

In step S314, when the verification operation performed based on the delay signal SIG_DELAY which is changed in the step S310 fails ('Y' in the step S312), the trainer 106 may set the delay count DELAY_COUNT as a second delay count B.

In step S316, the trainer 106 may set the average value of the first delay count A and the second delay count B that are stored in the steps S308 and S314 as the value of the delay signal SIG_DELAY. The trainer 106 may perform a training operation of positioning the sampling point of the data strobe signal DQS at the center of the cycle of the internal data DATA_INT by controlling the delayer 104 to output the internal data strobe signal DQS_INT based on the delay signal SIG_DELAY.

Step S350 may include steps S318 to S332.

In step S318, when the verification operation is successfully performed ('Y' in the step S302), the trainer 106 may provide the delayer 104 with the delay signal SIG_DELAY such that the delay 104 may delay the phase of the internal data strobe signal DQS_INT. In other words, the trainer 106 may increase the delay count DELAY COUNT, which is a value of the delay signal SIG_DELAY, and provide the delayer 104 with the delay signal SIG DELAY. The delayer 104 may output the internal data strobe signal DQS_INT that is delayed based on the delay signal SIG_DELAY.

In step S320, the trainer 106 may perform a verification operation again. When the verification operation performed based on the delay signal SIG_DELAY which is changed in the step S318 is still successful ('Y' in the step S320), the trainer 106 may repeatedly perform the operation of the step S318. The trainer 106 may delay the internal data strobe signal DQS_INT until the verification operation fails. In other words, the trainer 106 may repeatedly perform the operation of the step S318 until the sampling point of the data strobe signal DQS is positioned at the start point of the cycle of the data DATA_INT.

In step S322, when the verification operation performed based on the delay signal SIG_DELAY which is changed in the step S318 fails ('N' in the step S320), the trainer 106 may set the delay count DELAY_COUNT as the first delay count A.

In step S324, the trainer 106 may change the sampling point of the data strobe signal DQS which is used in the verification operation to a subsequent rising edge REF_EDGE_SUB which is delayed by one cycle. The trainer 106 may position the changed sampling point of the data strobe signal DQS at the end point of the cycle of the internal data DATA_INT.

In step S326, the trainer 106 may delay the phase of the internal data strobe signal DQS_INT by providing the delayer 104 with the delay signal SIG_DELAY. In other words, the trainer 106 may increase the delay count DELAY COUNT, which is a value of the delay signal SIG_DELAY, and provide the delayer 104 with the delay signal SIG DELAY. The delayer 104 may output the internal data strobe signal DQS_INT which is delayed based on the delay signal SIG_DELAY.

In step S328, the trainer 106 may perform a verification operation again. When the verification operation performed based on the delay signal SIG_DELAY which is changed in the step S328 is successfully performed ('N' in the step S328), the trainer 106 may repeatedly perform the operation of the step S326. The trainer 106 may delay the internal data strobe signal DQS_INT until the verification operation fails. In other words, the trainer 106 may repeatedly perform the operation of the step S326 until the sampling point of the data strobe signal DQS which is changed in the step S324 is positioned at the start point of the cycle of the internal data DATA_INT.

In step S330, when the verification operation performed based on the delay signal SIG_DELAY which is changed in the step S326 fails ('Y' in the step S328), the trainer 106 may set the delay count DELAY_COUNT as the second delay count B.

In step S332, the trainer 106 may designate the average value of the first delay count A and the second delay count B that are stored in the steps S322 and S330 as the value of the delay signal SIG_DELAY. The trainer 106 may perform a training operation of positioning the sampling point of the data strobe signal DQS at the center of the cycle of the internal data DATA_INT by controlling the delayer 104 to output the internal data strobe signal DQS_INT based on the delay signal SIG_DELAY.

Figure 4A:
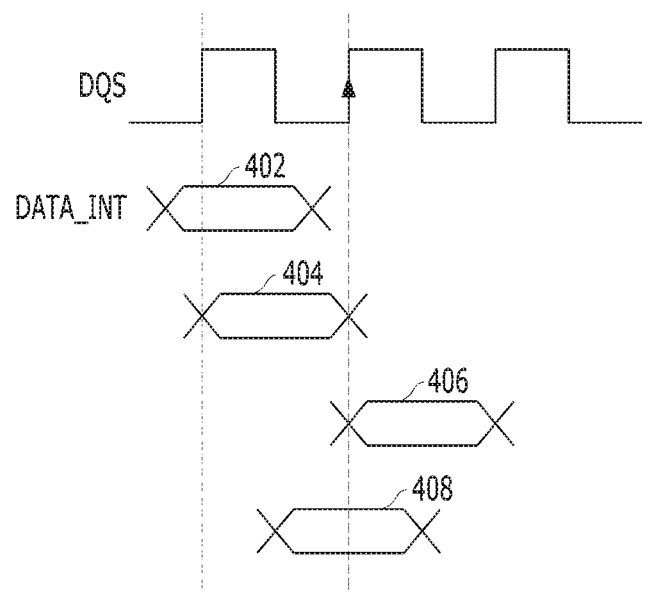
FIGS. 4A and 4B are timing diagrams illustrating a sampling point of a data strobe signal and data synchronized with an internal data strobe signal when a training operation is performed in accordance with an embodiment of the present invention.
Figure 4B:
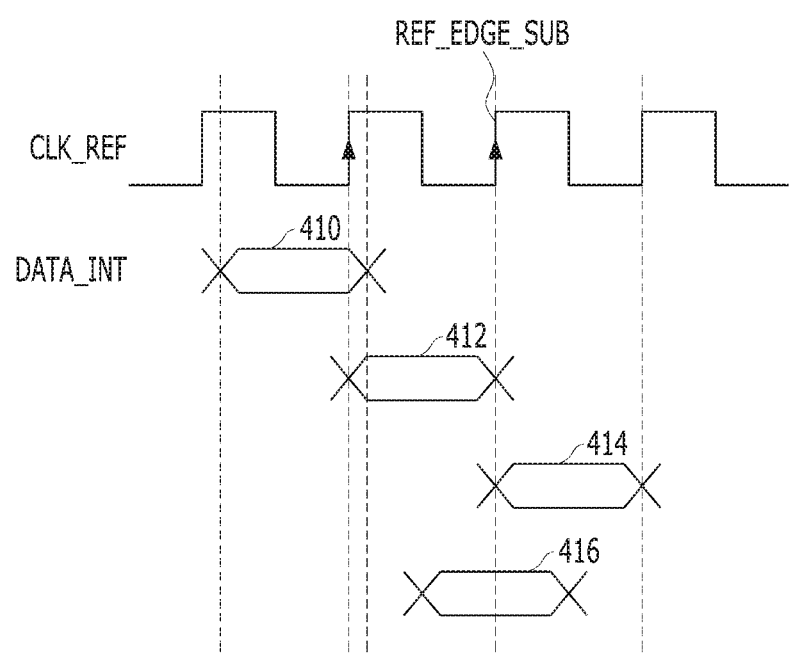

FIGS. 4A and 4B are timing diagrams illustrating a sampling point of the data strobe signal DQS and the data DATA_INT synchronized with the internal data strobe signal DQS_INT when a training operation is performed in accordance with an embodiment of the present Invention.

As shown in FIG. 4A, the sampling point of the data strobe signal DQS may not be positioned on the cycle of data 402 due to the influence of external factors even when the delay signal SIG_DELAY has the initial value as described above with reference to FIG. 2B. When the sampling point of the data strobe signal DQS is not positioned on the cycle of the data 402, the write data DATA_WRITE and the read data DATA_READ may be different. As described earlier in the step S302, the trainer 106 may fail the verification operation.

When the verification operation fails, the trainer 106 may perform a training operation of positioning the sampling point of the data strobe signal DQS at the center of the cycle of the internal data DATA_INT synchronized with the internal data strobe signal DQS_INT, as described above in the step S300. The trainer 106 may position the sampling point of the data strobe signal DQS at the end point of the cycle of data 404 as described with reference to FIG. 4A by repeatedly performing the operations of the steps S304 and S306. The trainer 106 may set the delay count DELAY_COUNT when the sampling point of the data strobe signal DQS is positioned at the end point of the cycle of the data 404 as the first delay count A.

The trainer 106 may position the sampling point of the data strobe signal DQS at the start point of the cycle of data 406 as shown in FIG. 4A by repeatedly performing the operations of the steps S310 and S312. The trainer 106 may store the delay count DELAY_COUNT when the sampling point of the data strobe signal DQS is positioned at the start point of the cycle of the data 406 as the second delay count B.

The trainer 106 may designate the average value of the first delay count A and the second delay count B as the value of the delay signal SIG_DELAY. As illustrated in FIG. 4A, the trainer 106 may position the sampling point of the data strobe signal DQS at the center of the cycle of data 408 based on the changed delay signal SIG_DELAY.

Referring to FIG. 4B, the sampling point of the data strobe signal DQS may be positioned on the cycle of data 410 due to the influence of external factors even when the delay signal SIG_DELAY has an Initial value as described above with reference to FIG. 2C. When the sampling point of the data strobe signal DQS is positioned on the cycle of the data 410, the write data DATA_WRITE and the read data DATA_READ may be the same, and as described above in the step S302, the trainer 106 may successfully perform the verification operation.

When the verification operation is successfully performed, the trainer 106 may perform a training operation of positioning the sampling point of the data strobe signal DQS at the center of the cycle of the internal data DATA_INT synchronized with the internal data strobe signal DQS_INT, as described above in the step S350. The trainer 106 may position the sampling point of the data strobe signal DQS at the start point of the cycle of data 412 as described with reference to FIG. 4B by repeatedly performing the operations of the steps S318 and S320. The trainer 106 may store the delay count DELAY_COUNT when the sampling point of the data strobe signal DQS is positioned at the start point of the cycle of the data 404 as the first delay count A.

The trainer 106 may change the sampling point of the data strobe signal DQS which Is used in the verification operation into a subsequent rising edge REF_EDGE_SUB, which is delayed by one cycle, as described in the step S324. The trainer 106 may position the changed sampling point REF_EDGE_SUB of the data strobe signal DQS at the end point of the cycle of data 412. The trainer 106 may position the sampling point REF_EDGE_SUB of the data strobe signal DQS at the start point of the cycle of data 414 as illustrated in FIG. 4B by repeatedly performing the operations of the steps S326 and S328. The trainer 106 may store the delay count DELAY_COUNT when the sampling point REF_EDGE_SUB of the data strobe signal DQS is positioned at the start point of the cycle of the data 406 as the second delay count B.

The trainer 106 may designate the average value of the first delay count A and the second delay count B as the value of the delay signal SIG_DELAY. As shown in FIG. 4B, the trainer 106 may position the sampling point REF_EDGE_SUB of the data strobe signal DQS at the center of the cycle of data 416 based on the changed delay signal SIG_DELAY.

According to the embodiment of FIG. 4B, when the delay signal SIG_DELAY has the initial value and the verification operation is successfully performed ('Y' in the step S302), the sampling point of the data strobe signal DQS may be positioned near the end point of the cycle of the data DATA_INT. Therefore, it is required to repeatedly perform a delay operation for an internal data strobe signal DQS_INT and the verification operation (i.e., a write/read verification operation) many times in order to position the sampling point of the data strobe signal DQS at the start point of the cycle of the data DATA_INT. Therefore, when the delay signal SIG_DELAY has the initial value and the write/read verification operation is successfully performed during a training operation, it may take a long time to complete the training operation, which is problematic.

According to with the embodiment of FIG. 4B, when the delay signal SIG_DELAY has the initial value and the verification operation is successfully performed ('Y' in the step S302), the trainer 106 may invert the internal data strobe signal DQS_INT. When the internal data strobe signal DQS_INT is inverted, the internal data strobe signal DQS_INT may be delayed by a half cycle. Therefore, the trainer 106 may position the sampling point of the data strobe signal DQS near the start point of the cycle of the data DATA_INT synchronized with the internal data strobe signal DQS_INT by inverting the internal data strobe signal DQS_INT, and then repeatedly perform a delay operation of an internal data strobe signal DQS_INT and a verification operation. Accordingly, it is possible to reduce the number of times the internal data strobe signal DQS_INT delay operation and the write/read verification operation are required to position the sampling point of the data strobe signal DQS at the start point of the cycle of the data DATA_INT. The trainer 106 may complete the training operation more quickly according to the reduced number of times of the delay operation and the write/read verification operation.

Hence, according to an embodiment of the present invention as described above, the sampling point of the data strobe signal DQS may be positioned at the center of the cycle by inverting the internal data strobe signal DQS_INT, increasing the delay signal SIG_DELAY until the verification operation fails, and then pulling forward the internal data strobe signal DQS_INT by a half cycle. Therefore, the operation of changing the sampling point of the data strobe signal DQS may not be performed, and since it does not need to repeatedly perform a delay operation of an internal data strobe signal DQS_INT and a write/read verification operation until the sampling point of the data strobe signal DQS is positioned at the start point of the cycle of the data DATA_INT after positioning the sampling point of the data strobe signal DQS at the end point of the cycle of the data DATA_INT, a training operation may be performed quickly.

Figure 5:
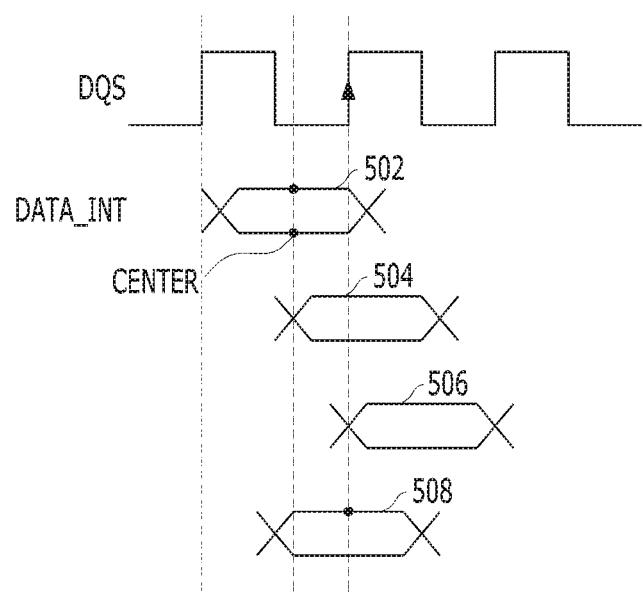
FIG. 5 is a timing diagram illustrating a sampling point of a data strobe signal and data synchronized with an internal data strobe signal when a training operation is performed in accordance with an embodiment of the present invention.

FIG. 5 is a timing diagram illustrating a sampling point of the data strobe signal DQS and the data DATA_INT synchronized with the internal data strobe signal DQS_INT when a training operation is performed in accordance with an embodiment of the present invention.

Referring to FIG. 5, the sampling point of the data strobe signal DQS may be positioned on the cycle of data 502 due to the influence of external factors even when the delay signal SIG_DELAY has an initial value as described above with reference to FIG. 4B. When the sampling point of the data strobe signal DQS is positioned on the cycle of the data 502, the write data DATA_WRITE and the read data DATA_READ may be the same, and as described above in the step S302, the trainer 106 may successfully perform the verification operation (i.e., the write/read verification operation).

Figure 6:
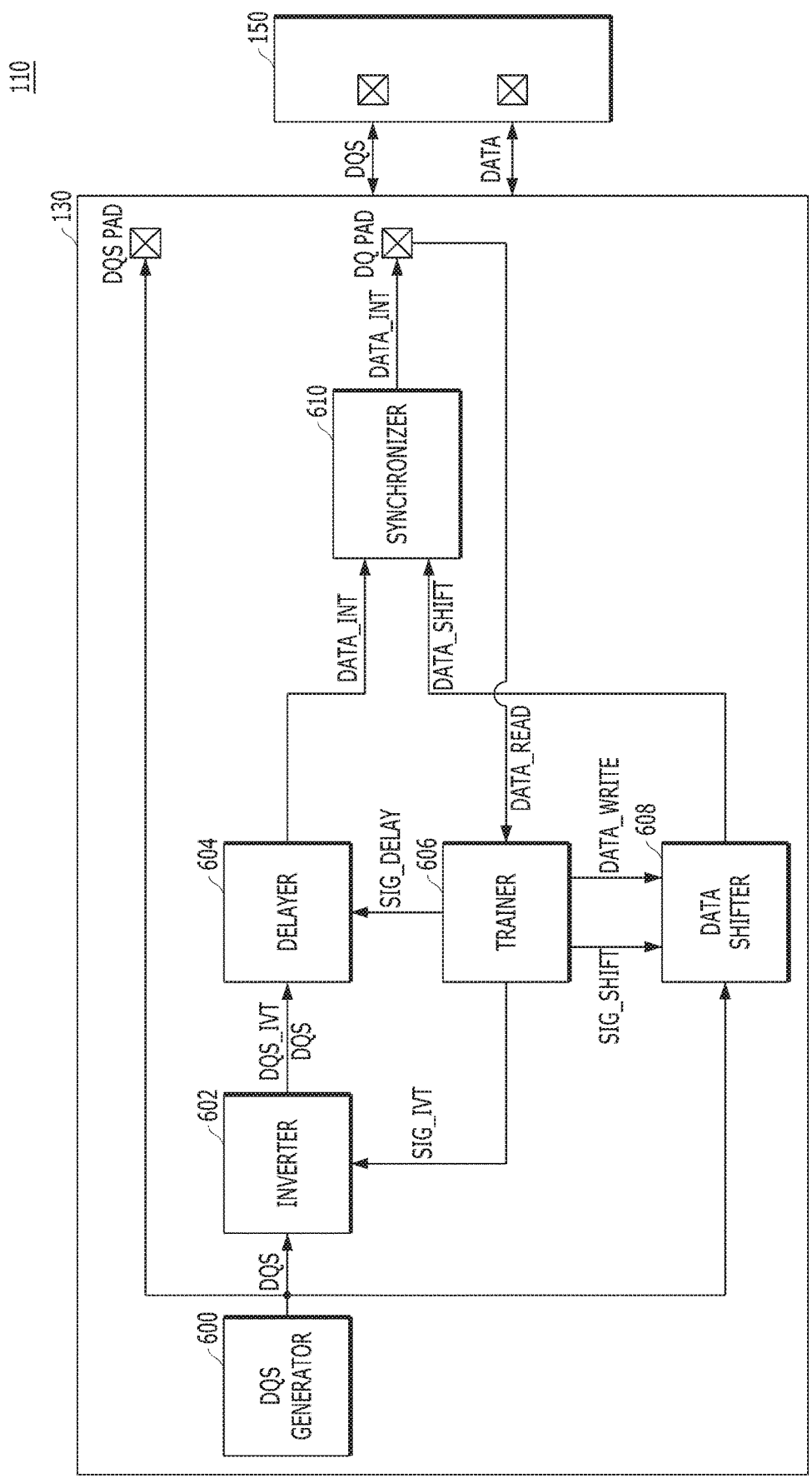
FIG. 6 is a block diagram illustrating a memory system in accordance with an embodiment of the present invention.
Figure 8:
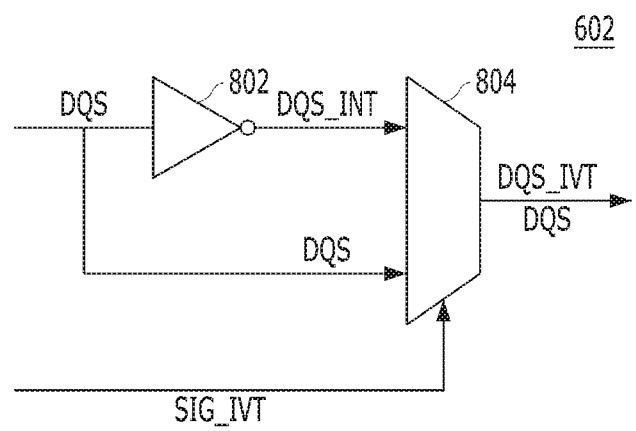
FIG. 8 is a diagram illustrating an inverter in accordance with an embodiment of the present invention.

Referring to FIGS. 6 and 8, a trainer 606 may invert the internal data strobe signal DQS_INT when the write/read verification operation is successfully performed. To be specific, the trainer 606 may provide an inverter 602 with an inversion signal SIG_IVT. The inverter 602 may invert the data strobe signal DQS and provide the delayer 604 with the inverted data strobe signal DQS_IVT. The phase of the inverted data strobe signal DQS_IVT may be delayed by a half cycle from the phase of the data strobe signal DQS that is inputted to the inverter 602. The delayer 604 may output the internal data strobe signal DQS_INT which is delayed by a half cycle by delaying the inverted data strobe signal DQS_IVT and outputting the internal data strobe signal DQS_INT.

Referring to FIGS. 5 and 6, the start point of the cycle of data 504 synchronized with the internal data strobe signal DQS_INT which is delayed according to the inversion signal SIG_IVT may be positioned at the center of the cycle of the data 502 in the initial state. In other words, the increase amount of the delay signal SIG_DELAY which needs to be increased until the sampling point of the data strobe signal DQS is positioned at the center of the cycle of the data 502 in the initial state may be the same as the increase amount of the delay signal SIG_DELAY which needs to be increased until the sampling point of the data strobe signal DQS is positioned at the start point of the cycle of an inverted data 506. Therefore, after inverting the internal data strobe signal DQS_INT, until a write/read verification operation fails, the trainer 606 may delay the internal data strobe signal DQS_INT, may provide the inverter 602 with the inversion signal SIG_IVT, and may control the inverter 602 not to invert the inputted data strobe signal DQS but to output the inputted data strobe signal DQS as it is. As illustrated in FIG. 5, when the start point of the cycle of the data 506 is positioned at the sampling point of the data strobe signal DQS and the data strobe signal DQS is not inverted, the center of the cycle of data 508 may be positioned at the sampling point of the data strobe signal DQS.

FIG. 6 is a block diagram illustrating a memory system 110 in accordance with an embodiment of the present invention.

Referring to FIG. 6, the memory system 110 may include a controller 130 and a memory device 150. The controller 130 may include a DQS generator 600, an inverter 602, a delayer 604, a trainer 606, a data shifter 608, and a synchronizer 610.

The DQS generator 600 may generate a data strobe signal DQS and provide the memory device 150 with the data strobe signal DQS via a DQ pad. Also, the DQS generator 600 may provide the inverter 602 and the data shifter 608 with the data strobe signal DQS.

The inverter 602 may invert the data strobe signal DQS under the control of the trainer 606. The inverted data strobe signal DQS_IVT may have a phase that is delayed by a half cycle from the data strobe signal DQS before being inverted. The inverter 602 may output the data strobe signal DQS provided from the DQS generator 600 as it is or may output a signal DQS_IVT obtained by inverting the data strobe signal DQS based on the inversion signal SIG_IVT which is provided from the trainer 606.

The delayer 604 may output the internal data strobe signal DQS_INT by delaying the data strobe signal DQS. The internal data strobe signal DQS_INT may have the same cycle as the data strobe signal DQS, but the internal data strobe signal DQS_INT and the data strobe signal DQS may have different phases depending on the degree of delay. When the inverter 602 outputs the inverted data strobe signal DQS_IVT based on the inversion signal SIG_IVT, the delayer 604 may output the internal data strobe signal DQS_INT by delaying the inverted data strobe signal DQS_IVT. When the inverter 602 outputs the inverted data strobe signal DQS_IVT, the delayer 604 may consequently output the inverted internal data strobe signal DQS_IVT. The internal data strobe signal DQS_INT may have a phase which is delayed by a half cycle from the internal data strobe signal DQS_INT before being inverted.

The data shifter 608 may delay the phase of the write data DATA_WRITE. The write data DATA_WRITE may be generated by the trainer 606 for a training operation. The data shifter 608 may synchronize the write data DATA_WRITE with a rising edge of the data strobe signal DQS. The data shifter 608 may delay the synchronized data DATA_REF based on the shift signal SIG_SHIFT which is provided from the trainer 606 (see FIG. 9). When the internal data strobe signal DQS_INT is delayed by a half cycle, the data shifter 608 may delay the synchronized data DATA_REF by a half cycle, by synchronizing the data DATA_REF with a falling edge of the data strobe signal DQS. When the internal data strobe signal DQS_INT is delayed by one cycle, the data shifter 608 may delay the data DATA_REF by one cycle by synchronizing a half cycle-delayed data DATA_SHIFT with a rising edge of the data strobe signal DQS. The data shifter 608 may select one among the data DATA_REF, the half cycle-delayed data DATA_SHIFT, and the one cycle-delayed data DATA_SHIFT2, and may provide the synchronizing unit 610 with the selected data. The data DATA_REF may be synchronized with the data strobe signal DQS. The half cycle-delayed data DATA_SHIFT1 may be obtained by delaying the data DATA_REF by a half cycle. The one cycle-delayed data DATA_SHIFT2 may be obtained by delaying the data DATA_REF by one cycle.

The synchronizer 610 may synchronize the data DATA_SHIFT with the internal data strobe signal DQS_INT. The synchronizer 610 may be realized as a flip-flop, and may synchronize the data DATA_SHIFT with a rising edge of the internal data strobe signal DQS_INT. The synchronizer 610 may provide the memory device 150 with the internal data DATA_INT synchronized with the internal data strobe signal DQS_INT via the DQ pad.

The trainer 606 may perform a training operation to synchronize the internal data strobe signal DQS_INT to have a phase difference of a half cycle from the data strobe signal DQS. Specifically, the trainer 606 may perform a training operation to position the sampling point of the data strobe signal DQS at the center of the cycle of the internal data DATA_INT. The trainer 606 may perform a verification operation, which is an operation of verifying the read data of the memory device 150 by comparing the write data DATA_WRITE with the read data DATA_READ.

The trainer 606 may control the delayer 604 to output the internal data strobe signal DQS_INT based on the result of the verification operation. When the verification operation is successfully performed, the trainer 606 may generate the inversion signal SIG_IVT and invert the start point of the cycle of the internal data DATA_INT. The trainer 606 may provide the inverter 602 with the inversion signal SIG_IVT and control the inverter 602 to provide the delayer 604 with the inverted data strobe signal DQS. The delayer 604 may output the inverted internal data strobe signal DQS_IVT by delaying the inverted data strobe signal DQS and outputting the internal data strobe signal DQS_INT.

The trainer 606 may control the delayer 604 to invert the internal data strobe signal DQS_INT until the verification operation fails after inverting the internal data strobe signal DQS_INT. The trainer 606 may store the value of the delay signal SIG_DELAY when the verification operation fals and control the inverter 602 not to invert the data strobe signal DQS but to output the data strobe signal DQS as it is. The trainer 606 may quickly perform the training operation by controlling the delayer 604 to output the internal data strobe signal DQS_INT based on the delay signal SIG_DELAY.

The trainer 606 may generate the write data DATA_WRITE and provide the data shifter 608 with the generated data DATA_WRITE. The trainer 606 may control the data shifter 608 to delay the phase of the write data DATA_WRITE synchronized with the data strobe signal DQS based on the shift signal SIG_SHIFT. When the phase difference between the data strobe signal DQS and the internal data strobe signal DQS_INT is less than a half cycle, the trainer 606 may control the data shifter 608 by setting the shift signal SIG_SHIFT value to output the data that is synchronized with a rising edge of the data strobe signal DQS. When the phase difference between the data strobe signal DQS and the internal data strobe signal DQS_INT is greater than or equal to a half cycle and less than one cycle, the trainer 606 may control the data shifter 608 by setting the value of the shift signal SIG_SHIFT to delay the data synchronized with a rising edge of the data strobe signal DQS by a half cycle and output the half cycle-delayed data DATA_SHIFT1.

Figure 7:
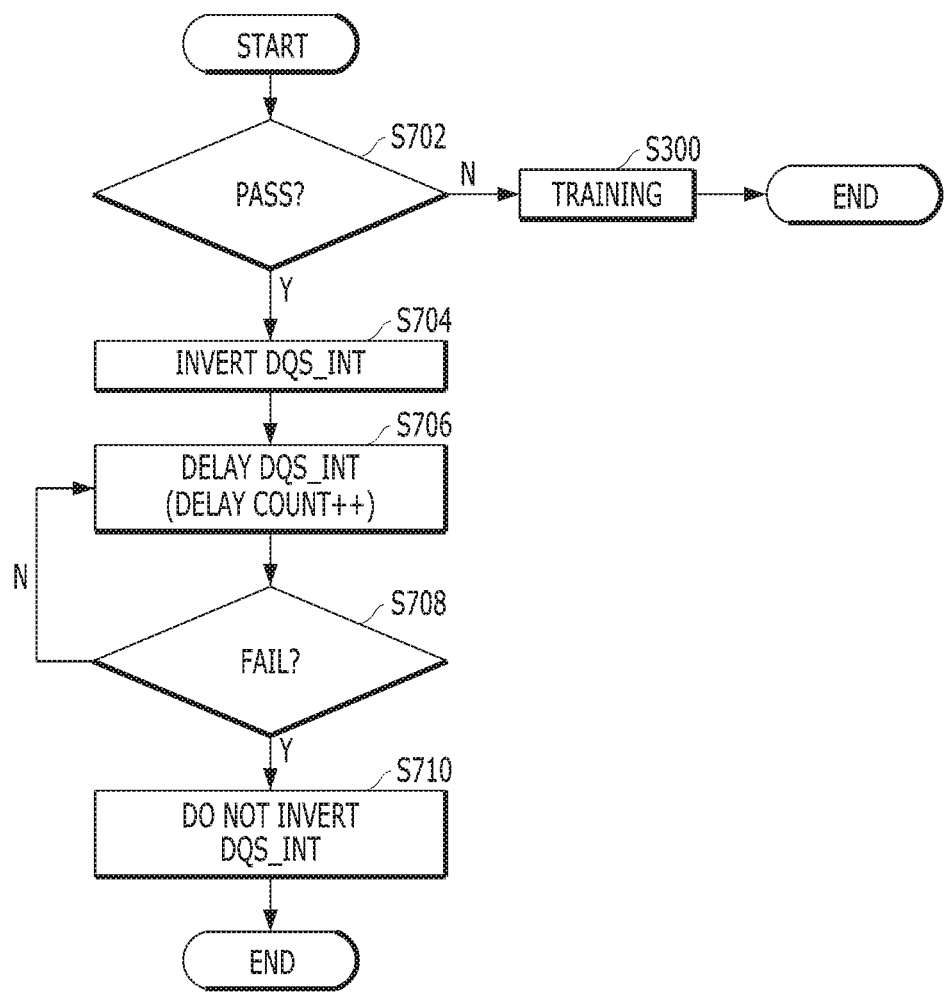
FIG. 7 is a flowchart of a training operation in accordance with an embodiment of the present invention.

FIG. 7 is a flowchart illustrating a training operation in accordance with an embodiment of the present invention.

Referring to FIG. 7, in step S702, the trainer 606 may perform a verification operation (i.e., a write/read verification operation). When the sampling point of the data strobe signal DQS is not positioned on the cycle of the internal data DATA_INT, write data DATA and read data DATA may be different and the trainer 606 may fail the verification operation. When the sampling point of the data strobe signal DQS is positioned on the cycle of the internal data DATA_INT, the write data DATA and the read data DATA may be the same and the trainer 606 may successfully perform the verification operation. When the verification operation fails ('N' in the step S702), the trainer 606 may perform the operation of the step S300 as described above with reference to FIG. 3.

In step S704, when the verification operation is successfully performed ('Y' in the step S702), the trainer 606 may invert the internal data strobe signal DQS_INT. The trainer 606 may provide the inverter 602 with the inversion signal SIG_IVT and control the inverter 602 to provide the delayer 604 with the inverted data strobe signal DQS_IVT. Since the delayer 604 delays the inverted data strobe signal DQS_IVT to output the internal data strobe signal DQS_INT, the delayer 604 may output the internal data strobe signal DQS_INT under the control of the trainer 606.

In step S706, the trainer 606 may delay the phase of the internal data strobe signal DQS_INT by providing the delayer 604 with the delay signal SIG_DELAY. The trainer 606 may increase the delay count DELAY COUNT which is a value of the delay signal SIG_DELAY and provide the delayer 604 with the delay signal SIG_DELAY. The delayer 604 may output the internal data strobe signal DQS_INT which is delayed based on the delay signal SIG_DELAY.

In step S708, the trainer 606 may perform a verification operation again. When the verification operation performed based on the delay signal SIG_DELAY which is changed in the step S706 is successfully performed ('N' in the step S708), the trainer 606 may repeatedly perform the operation of the step S706 until the verification operation fails. In other words, the trainer 606 may delay the internal data strobe signal DQS_INT until the sampling point of the data strobe signal DQS is positioned at the start point of the cycle of the internal data DATA_INT.

In step S710, when the verification operation fails ('Y' in the step S708), the trainer 606 may store the value of the delay signal SIG_DELAY and control the inverter 602 not to invert the inputted data strobe signal DQS based on the inversion signal SIG_IVT but to output the inputted data strobe signal DQS as it is. The trainer 606 may quickly perform a training operation of positioning the sampling point of the data strobe signal DQS at the center of the data DATA_INT by controlling the delayer 604 to output the internal data strobe signal DQS_INT based on the delay signal SIG_DELAY.

FIG. 8 is a diagram illustrating an Inverter 602 in accordance with an embodiment of the present invention.

Referring to FIG. 8, the inverter 602 may include an inverting element 802 and a multiplexer 804.

The inverting element 802 may invert the data strobe signal DQS and output the inverted data strobe signal DQS_IVT. The inverted data strobe signal DQS_IVT may be delayed in its phase by a half cycle from the data strobe signal DQS.

The multiplexer 804 may output one signal between the inverted data strobe signal DQS_IVT obtained based on the inversion signal SIG_IVT and the data strobe signal DQS whose phase is not inverted. The trainer 606 may generate the inversion signal SIG_IVT. The inversion signal SIG_IVT may be realized as a code. In the initial state, the trainer 606 may generate the inversion signal SIG_IVT to output the data strobe signal DQS which is not inverted. When a write/read verification operation is successfully performed, the inversion signal SIG_IVT may be generated to output the inverted data strobe signal DQS_IVT. When the verification operation fails according to the delay operation of the internal data strobe signal DQS_INT, the trainer 606 may generate the inversion signal SIG_IVT to output a data strobe signal DQS that is not inverted.

Figure 9:
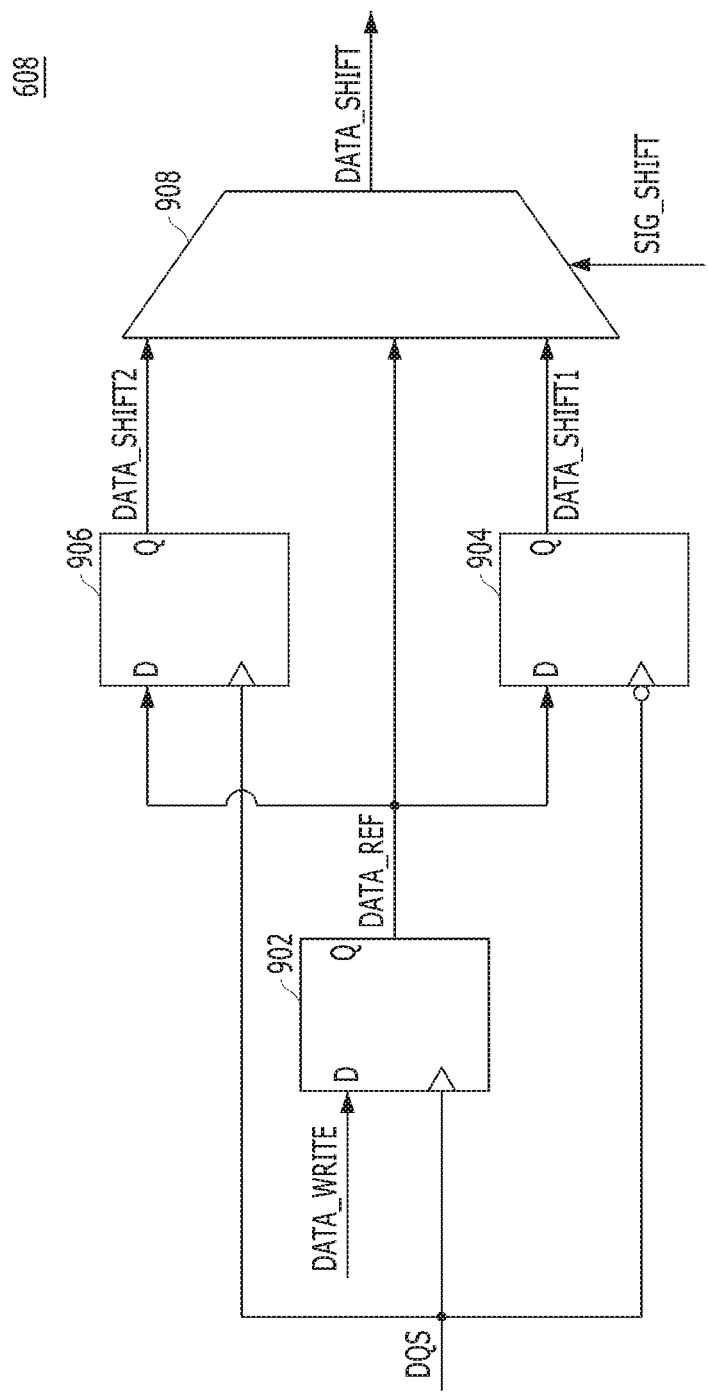
FIG. 9 is a diagram illustrating a data shifter in accordance with an embodiment of the present invention.

FIG. 9 is a diagram illustrating a data shifter 608 in accordance with an embodiment of the present invention.

Referring to FIG. 9, the data shifter 608 may include first to third flip-flops 902 to 906 and a multiplexer 908.

The first flip-flop 902 may synchronize the write data DATA_WRITE generated by the trainer 606 with a rising edge of the data strobe signal DQS. The first flip-flop 902 may receive data DATA_REF and output the data DATA_REF. The data DATA_REF may be synchronized to have the value of the write data DATA_WRITE right before a rising edge from the rising edge to the subsequent rising edge.

The second flip-flop 904 may synchronize the data DATA_REF with a falling edge of the data strobe signal DQS. The second flip-flop 904 may receive the DATA_REF from the first flip-flop 902, delay the output DATA_REF by a half cycle and output half cycle-delayed data DATA_SHIFT1, by synchronizing the output DATA_REF with a falling edge of the data strobe signal DQS.

The third flip-flop 906 may synchronize the data DATA_REF with a rising edge of the data strobe signal DQS. The third flip-flop 906 may receive the DATA_REF from the first flip-flop 902, delay the data DATA_REF by one cycle and output one cycle-delayed data DATA_SHIFT2, by synchronizing the output DATA_REF with a rising edge of the data strobe signal DQS.

The multiplexer 908 may output one signal DATA_SHIFT among the output DATA_REF, the output DATA_SHIFT, and the output DATA_SHIFT2 based on the shift signal SIG_SHIFT, which is provided from the trainer 606.

Figure 10:
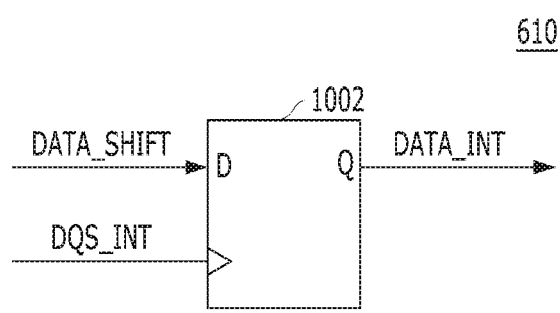
FIG. 10 is a diagram illustrating a synchronizer in accordance with an embodiment of the present invention.

FIG. 10 is a diagram illustrating a synchronizer in accordance with an embodiment of the present invention.

Referring to FIG. 10, the synchronizer 610 may include a flip flop 1002.

The flip-flop 1002 may receive the data DATA_SHIFT from the data shifter 608 and synchronize the data DATA_SHIFT with the internal data strobe signal DQS_INT. The flip-flop 1002 may synchronize the data DATA_SHIFT with a rising edge of the internal data strobe signal DQS_INT. The flip-flop 1002 may output the data DATA_INT synchronized with the internal data strobe signal DQS_INT.

According to the embodiments, the data transfer efficiency may be improved by synchronizing the sampling point of a data strobe signal with the center of the time cycle of an internal data strobe signal through a training operation.

While the present invention has been described with respect to specific embodiments, it will be apparent to those with ordinary skill in the art that various changes and modifications may be made without departing from the spirit and scope of the invention as defined in the following claims.

What is claimed is:

1. A memory system comprising:
a memory; and
a controller suitable for providing the memory with:
   a data strobe signal (DQS); and
   data that is synchronized with an internal data strobe signal,
wherein the controller includes:
   a signal generator suitable for generating the data strobe signal,
   an inverter suitable for receiving the data strobe signal and selectively outputting one signal between a non-inverted data strobe signal having the same phase as the data strobe signal and an inverted data strobe signal having an inverted phase to the phase of the data strobe signal based on an inversion signal,
   a delayer suitable for delaying the inverted data strobe signal or the non-inverted data strobe signal based on a delay signal and outputting the internal data strobe signal, and
   a trainer suitable for performing a verification operation on the synchronized data to produce a verification operation result, and generating the inversion signal and the delay signal based on the verification operation result,
   wherein, when the verification operation is successfully performed, the trainer generates the inversion signal so that the inverter outputs the inverted data strobe signal and generates the delay signal by increasing a value of the delay signal until the verification operation fails, and when the verification operation fails, the trainer generates the inversion signal so that the inverter outputs the non-inverted data strobe signal.

2. The memory system of claim 1, wherein the trainer generates write data for the verification operation.

3. The memory system of claim 2, wherein the controller further includes:
a data shifter suitable for synchronizing the write data with the data strobe signal and delaying the write data based on a shift signal.

4. The memory system of claim 3, wherein the controller further includes:
a synchronizer suitable for re-synchronizing the synchronized write data with the internal data strobe signal.

5. The memory system of claim 2, wherein the trainer passes the verification operation when the write data is the same as read data.

6. The memory system of claim 4, wherein the synchronizer includes:
a flip-flop suitable for re-synchronizing the synchronized write data to a rising edge of the internal data strobe signal.

7. The memory system of claim 1, wherein the inverter includes:
an inverting element suitable for inverting the data strobe signal; and
a multiplexer suitable for outputting either the inverted data strobe signal or the non-inverted data strobe signal in response to the inversion signal.

8. The memory system of claim 1, wherein, when the verification operation fails, the trainer increments the value of the delay signal until the verification operation is successfully performed to produce incremented values of the delay signal, and stores the value of the delay signal when the verification operation is successfully performed among the incremented values of the delay signal as a first delay count.

9. The memory system of claim 8, wherein, after storing the first delay count, the trainer further increments the incremented values of the delay signal until the verification operation fails and stores the value of the delay signal when the verification operation fails among the further incremented values of the delay signal as a second delay count, and sets an average value of the first delay count and the second delay count as the value of the delay signal.

10. A method for operating a memory system, comprising:
providing a memory with a data strobe signal (DQS) and data that is synchronized with an internal data strobe signal;
generating the data strobe signal;
selectively outputting one signal between a non-inverted data strobe signal having the same phase as the data strobe signal and an inverted data strobe signal having an inverted phase to the phase of the data strobe signal based on an inversion signal;
delaying the inverted data strobe signal or the non-inverted data strobe signal based on a delay signal and outputting the internal data strobe signal;
generating the inversion signal for outputting the inverted data strobe signal when a verification operation is successfully performed;
generating the delay signal by increasing a value of the delay signal until the verification operation fails; and
generating the inversion signal to output the non-inverted data strobe signal when the verification operation fails.

11. The method of claim 10, further comprising:
generating write data for the verification operation.

12. The method of claim 11, further comprising:
synchronizing the write data with the data strobe signal and delaying the write data based on a shift signal.

13. The method of claim 12, further comprising:
re-synchronizing the synchronized write data with the internal data strobe signal.

14. The method of claim 11, further comprising:
determining that the verification operation passes when the write data is the same as read data.

15. The method of claim 13, wherein the re-synchronizing of the synchronized write data with the internal data strobe signal comprises
re-synchronizing the synchronized write data with a rising edge of the internal data strobe signal.

16. The method of claim 10, wherein the selectively outputting of the one signal includes:
inverting the data strobe signal; and
outputting the one signal between the inverted data strobe signal and the non-inverted data strobe signal.

17. The method of claim 10, further comprising:
incrementing the value of the delay signal until the verification operation is successfully performed when the verification operation fails; and
storing the value of the delay signal when the verification operation is successfully performed among the incremented values of the delay signal as a first delay count.

18. The method of claim 17, further comprising:
further incrementing the incremented values of the delay signal until the verification operation fails after storing the first delay count;

storing the value of the delay signal when the verification operation fails among the further incremented values of the delay signal as a second delay count; and setting an average value of the first delay count and the second delay count as the value of the delay signal.

19. A circuit comprising:

a signal generator suitable for generating a data strobe signal (DQS);

an inverter suitable for selectively inverting the data strobe signal to output a selected data strobe signal among a non-inverted data strobe signal and an inverted data strobe signal;

a delayer suitable for delaying the selected data strobe signal based on a delay signal to output the delayed data strobe signal as an internal data strobe signal;

a synchronizer suitable for synchronizing data with the internal data strobe signal to output an internal data through a data pad;

a trainer suitable for performing a verification operation between the internal data and input data received from the data pad, and generating the inversion signal and the delay signal based on the verification operation such that a phase difference between the internal data and the internal data strobe signal has a set phase difference, wherein the trainer generates the inversion signal such that the inverter outputs the inverted data strobe signal and generates the delay signal having a delay value corresponding to a fail of the verification operation when the verification operation is successfully performed, and wherein the trainer generates the inversion signal so that the inverter outputs the non-inverted data strobe signal when the verification operation fails.

* * * * *